(12) United States Patent
Mao et al.

(10) Patent No.: US 12,107,179 B2
(45) Date of Patent: Oct. 1, 2024

(54) PHOTOVOLTAIC ASSEMBLY

(71) Applicants: CSI CELLS CO., LTD., Jiangsu (CN); CSI SOLAR CO., LTD., Jiangsu (CN); CANADIAN SOLAR MANUFACTURING (CHANGSHU) INC., Jiangsu (CN)

(72) Inventors: Jianyu Mao, Jiangsu (CN); Xuanxuan Liu, Jiangsu (CN); Jingbing Dong, Jiangsu (CN); Xiujuan Pan, Jiangsu (CN); Fuyang Huang, Jiangsu (CN); Alan Xu, Jiangsu (CN)

(73) Assignees: CSI CELLLS CO., LTD., Suzhou (CN); CSI SOLAR CO., LTD, Suzhou (CN); CANADIAN SOLAR MANUFACTURING (CHANGSHU) INC., Suzhou (CN)

( * ) Notice: Subject to any disclaimer, the term of this patent is extended or adjusted under 35 U.S.C. 154(b) by 41 days.

(21) Appl. No.: 17/936,066

(22) Filed: Sep. 28, 2022

(65) Prior Publication Data
US 2023/0023997 A1    Jan. 26, 2023

Related U.S. Application Data

(63) Continuation of application No. PCT/CN2021/083146, filed on Mar. 26, 2021.

(30) Foreign Application Priority Data

Apr. 7, 2020    (CN) .......................... 202020493920.2
Mar. 8, 2021    (CN) .......................... 202120492359.0

(51) Int. Cl.
H02S 40/34    (2014.01)
H01L 31/048    (2014.01)
(Continued)

(52) U.S. Cl.
CPC ........ *H01L 31/0488* (2013.01); *H01L 31/049* (2014.12); *H01L 31/05* (2013.01); *H01L 31/054* (2014.12); *H02S 40/34* (2014.12)

(58) Field of Classification Search
CPC ....... H01L 31/00–078; Y02E 10/50–60; H02S 40/20–38
(Continued)

(56) References Cited

U.S. PATENT DOCUMENTS

| | | | | |
|---|---|---|---|---|
| 2016/0141435 | A1* | 5/2016 | Sridhara | B23H 7/20 136/244 |
| 2016/0308082 | A1 | 10/2016 | Ishii et al. | |
| 2019/0319579 | A1* | 10/2019 | Shugar | H02S 40/22 |

FOREIGN PATENT DOCUMENTS

| | | |
|---|---|---|
| CN | 205657072 U | 10/2016 |
| CN | 207947297 U | 10/2018 |

(Continued)

OTHER PUBLICATIONS

JP-2006286789-A English (Year: 2006).*
(Continued)

*Primary Examiner* — Bach T Dinh
(74) *Attorney, Agent, or Firm* — Grossman, Tucker, Perreault & Pfleger, PLLC

(57) ABSTRACT

A photovoltaic assembly includes a cell unit layer, a backplate and a reflective layer. The backplate is provided on a back side of the cell unit layer, and one side of the backplate away from the cell unit layer is provided with at least one junction box. The reflective layer is disposed between the cell unit layer and the backplate. The reflective layer includes a plurality of reflective longitudinal strips. Each of the plurality of reflective longitudinal strips covers edges of cell chips within at least one cell string. At least one of the plurality of reflective longitudinal strips is broken at a
(Continued)

location adjacent to a cell chip covered by the junction box so as to form at least one opening.

19 Claims, 6 Drawing Sheets

(51) Int. Cl.
    *H01L 31/049* (2014.01)
    *H01L 31/05* (2014.01)
    *H01L 31/054* (2014.01)

(58) Field of Classification Search
    USPC .................................................. 136/243–265
    See application file for complete search history.

(56) References Cited

FOREIGN PATENT DOCUMENTS

| | | |
|---|---|---|
| CN | 208706667 U | 4/2019 |
| CN | 209282216 U | 8/2019 |
| CN | 209447824 U | 9/2019 |
| CN | 110299424 A | 10/2019 |
| CN | 110571291 A | 12/2019 |
| CN | 211828793 U | 10/2020 |
| CN | 112382683 A | 2/2021 |
| JP | 11214734 A | 8/1999 |
| JP | 2006073707 A | 3/2006 |
| JP | 2006286789 A * | 10/2006 |
| JP | 2010287688 A | 12/2010 |
| JP | 2014036044 A | 2/2014 |
| JP | 2015533028 A | 11/2015 |
| JP | WO2015098203 A1 | 3/2017 |
| KR | 101911845 B1 * | 10/2018 |
| WO | 20170200487 A1 | 11/2017 |

OTHER PUBLICATIONS

KR-101911845-B1 English (Year: 2018).*
International Search Report from corresponding International Application No. PCT/CN2021/083146, dated Jul. 7, 2021. English translation attached.
Written Opinion from corresponding International Application No. PCT/CN2021/083146, dated Jul. 7, 2021. English translation attached.
Notice of Reasons for Refusal of the corresponding JP application No. 2022-561677 issued on Oct. 3, 2023 from the JPO. (English Translation Attached).
Extended European Search Report of the corresponding EP application No. 21785021.3 issued on Apr. 16, 2024 from the EPO.

* cited by examiner

PHOTOVOLTAIC ASSEMBLY

CROSS REFERENCE OF RELATED APPLICATION

The present application is a continuation of International Application No. PCT/CN2021/083146, filed on Mar. 26, 2021, which claims the priorities of the Chinese Patent Application No. 202020493920.2 which is entitled "PHOTOVOLTAIC ASSEMBLY" and filed on Apr. 7, 2020, and of the Chinese Patent Application No. 202120492359.0 which is entitled "PHOTOVOLTAIC ASSEMBLY" and filed on Mar. 8, 2021, all of which are hereby incorporated by reference in their entireties.

TECHNICAL FIELD

The present disclosure relates to the filed of photovoltaic technology, and more particularly, to a photovoltaic assembly.

BACKGROUND

As the market demand for a photovoltaic assembly is rapidly growing, the user requirement for the photovoltaic assembly is also getting higher. Users hope that a photovoltaic assembly can have good applicability for different scenarios and installing environments while a higher efficiency of the photovoltaic assembly can still be guaranteed. Thus, double-glazed photovoltaic assembly emerges with an aim to meet such requirement. However, in related art, the double-glazed photovoltaic assembly has its cell chips at the back side covered by a junction box, thus the double-glazed photovoltaic assembly has a relative high risk of current mismatch and a lower reliability.

SUMMARY

The present disclosure aims to solve at least one of the technical problems in the prior art. To this end, one goal of the present disclosure is to provide a voltaic assembly which can reduce current mismatch in the cell chips and improve the reliability of the voltaic assembly.

According to an embodiment of the present disclosure, a photovoltaic assembly is provided. The photovoltaic assembly includes: a cell unit layer including a plurality of cell units, each of the plurality of cell units including a plurality of cell strings, each of the plurality of cell strings including a plurality of cell chips that are connected in series and arranged in an arranging direction, the plurality of cell strings being arranged in a direction vertical to the arranging direction of the plurality of cell chips in each of the plurality of cell strings, and the plurality of cell units being arranged in the arranging direction of the plurality of cell chips in each of the plurality of cell strings; a backplate provided on a back side of the cell unit layer, one side of the backplate away from the cell unit layer being provided with at least one junction box, the junction box being positioned between two adjacent cell units of the plurality of cell units, and the junction box covering at least one cell chip of at least one cell unit of the plurality of cell units; and a reflective layer provided between the cell unit layer and the backplate, the reflective layer including a plurality of longitudinal reflective strips, the plurality of longitudinal reflective strips being separate from each other along the direction in which the plurality of cell strings are arranged, each of the plurality of longitudinal reflective strips extending in a direction parallel to the arranging direction of the plurality of cell chips in each of the plurality of cell strings, each of the plurality of longitudinal reflective strips covering an edge of at least one cell chip in at least one of the plurality of cell strings, and at least one of the plurality of longitudinal reflective strips being broken at a location adjacent to the at least one cell chip covered by the at least one junction box to form at least one opening.

In the photovoltaic assembly according to embodiments of the present disclosure, the cell unit layer, the backplate and the reflective layer including a plurality of longitudinal reflective strips are provided, each of the plurality of longitudinal reflective strips is arranged to cover edges of the cell chips in at least one cell string, and at least one of the plurality of longitudinal reflective strips is provided to be broken at a location adjacent to a cell chip covered by the junction box to form at least one opening. In this way, on one hand, the opening may avoid covering the cell chip so as to effectively reduce the current mismatch of the cell chip and to guarantee the reliability of the photovoltaic assembly, and on the other hand, the material cost of the photovoltaic assembly can be lowered.

According to some embodiments of the present disclosure, the opening is located at the cell chip covered by the junction box, and a light-receiving area of the cell chip covered by the junction box in the cell unit is equal to a light-receiving area of each of other cell chips in the cell unit.

According to some embodiments of the present disclosure, two adjacent cell chips in each of the plurality of cell strings that are adjacent to the junction box are a first cell chip and a second cell chip, the second cell chip being located at one side of the first cell chip away from the junction box; two adjacent cell units of the plurality of cell units are a first cell unit and a second cell unit; and the opening has one end located between the first cell chip and the second cell chip of a cell string of the first cell unit and another end located between the first cell chip and the second cell chip of a cell string of the second cell unit.

According to some embodiments of the present disclosure, the cell chip has a width D in the arranging direction of the plurality of cell chips in each of the plurality of cell strings, a portion of the opening that is in the first cell unit has a length d, and the D and d satisfy d=D and 82 mm ≤ D ≤ 120 mm.

According to some embodiments of the present disclosure, each of the plurality of longitudinal reflective strips has one opening.

According to some embodiments of the present disclosure, the plurality of longitudinal reflective strips include: two edge reflective strips located at edges of the cell unit layer in the direction in which the plurality of cell strings are arranged, each of the two edge reflective strips covering the edges of the cell chips in the corresponding cell string; and at least one middle reflective strip located between the two edge reflective strips, the middle reflective strip being located between two adjacent cell strings and covering edges of the cell chips in the two adjacent cell strings.

According to some embodiments of the present disclosure, the reflective layer further includes: a plurality of first transverse reflective strips connected between the two edge reflective strips and spaced apart from each other along the arranging direction of the plurality of cell chips in each of the plurality of cell strings, and each of the plurality of first transverse reflective strips extending along the direction in which the plurality of cell strings are arranged and covering edges of the corresponding cell chips.

According to some embodiments of the present disclosure, in each of the plurality of cell units, the first transverse reflective strip is provided between every two adjacent cell chips along the arranging direction of the plurality of cell chips in each of the plurality of cell strings, and the first transverse reflective strip covers edges of the two corresponding adjacent cell chips in all of the cell strings.

According to some embodiments of the present disclosure, each of the plurality of first transverse reflective strips has a width smaller than that of each of the plurality of longitudinal reflective strips.

According to some embodiments of the present disclosure, the first transverse reflective strip has a width $W_1$, and $W_1$ satisfies 0 mm<$W_1$ ≤6 mm.

According to some embodiments of the present disclosure, the reflective layer further includes: a second transverse reflective strip located between two cell units that are adjacent to each other in the plurality of cell units, the second transverse reflective strip extending along the direction in which the plurality of cell strings are arranged, and the second transverse reflective strip covering edges of cell chips adjacent to each other in the two cell units adjacent to each other.

According to some embodiments of the present disclosure, one of the plurality of longitudinal reflective strips faces towards the junction box and is formed with the opening, the opening is formed as a through-hole for a wire to pass through, and the through-hole faces towards the junction box.

According to some embodiments of the present disclosure, the plurality of longitudinal reflective strips include a plurality of first reflective strips and a plurality of second reflective strips, and one first reflective strip is provided between every two second reflective strips that are adjacent to each other; and the at least one junction box includes a plurality of junction boxes, the plurality of junction boxes are in one-to-one correspondence with the plurality of first reflective strips, and each of the plurality of second reflective strips is provided with the opening.

According to some embodiments of the present disclosure, each of the plurality of first reflective strips is provided with the opening, and the opening of the first reflective strip has a length smaller than that of the opening of the second reflective strip.

According to some embodiments of the present disclosure, the opening has length L, and L satisfies 0 mm<L ≤500 mm.

According to some embodiments of the present disclosure, a distance d between two cell chips that are adjacent to each other in each of the plurality of cell strings satisfies 0 mm≤d≤2 mm.

According to some embodiments of the present disclosure, each of the plurality of longitudinal reflective strips has a width $W_2$, and $W_2$ satisfies 2 mm ≤$W_2$≤15 mm.

According to some embodiments of the present disclosure, the reflective layer is a reflective coating layer applied onto a surface of one side of the backplate that is adjacent to the cell unit layer; or an encapsulation film is provided between the backplate and the cell unit layer, and the reflective layer is provided on the encapsulation film.

According to some embodiments of the present disclosure, each of the plurality of longitudinal reflective strips has a length of a, the maximum distance between two cell chips farthest away from each other in the arranging direction of the plurality of cell chips in each of the plurality of cell strings is b, and a and b satisfy 0.7≤a/b≤1.3.

According to some embodiments of the present disclosure, the number of the plurality of cell units is two, the two cell units are connected in parallel, each of the two cell units includes six cell strings connected in series, and every two cell strings that are adjacent to each other along the direction in which the plurality of cell strings are arranged form one group of cell strings; and the number of the at least one junction boxes is three, and each of the three junction boxes is located between two cell strings in a corresponding group of cell strings.

Additional aspects and advantages of the present disclosure will be given at least in part in the following description, or become apparent partially from the following description, or can be learned from practicing of the present disclosure.

BRIEF DESCRIPTION OF DRAWINGS

The above and/or additional aspects and advantages of the present disclosure will become clear and easy to understand from the description of embodiments below in conjunction with the accompanying drawings, in which.

REFERENCE NUMERALS

Figure 1:
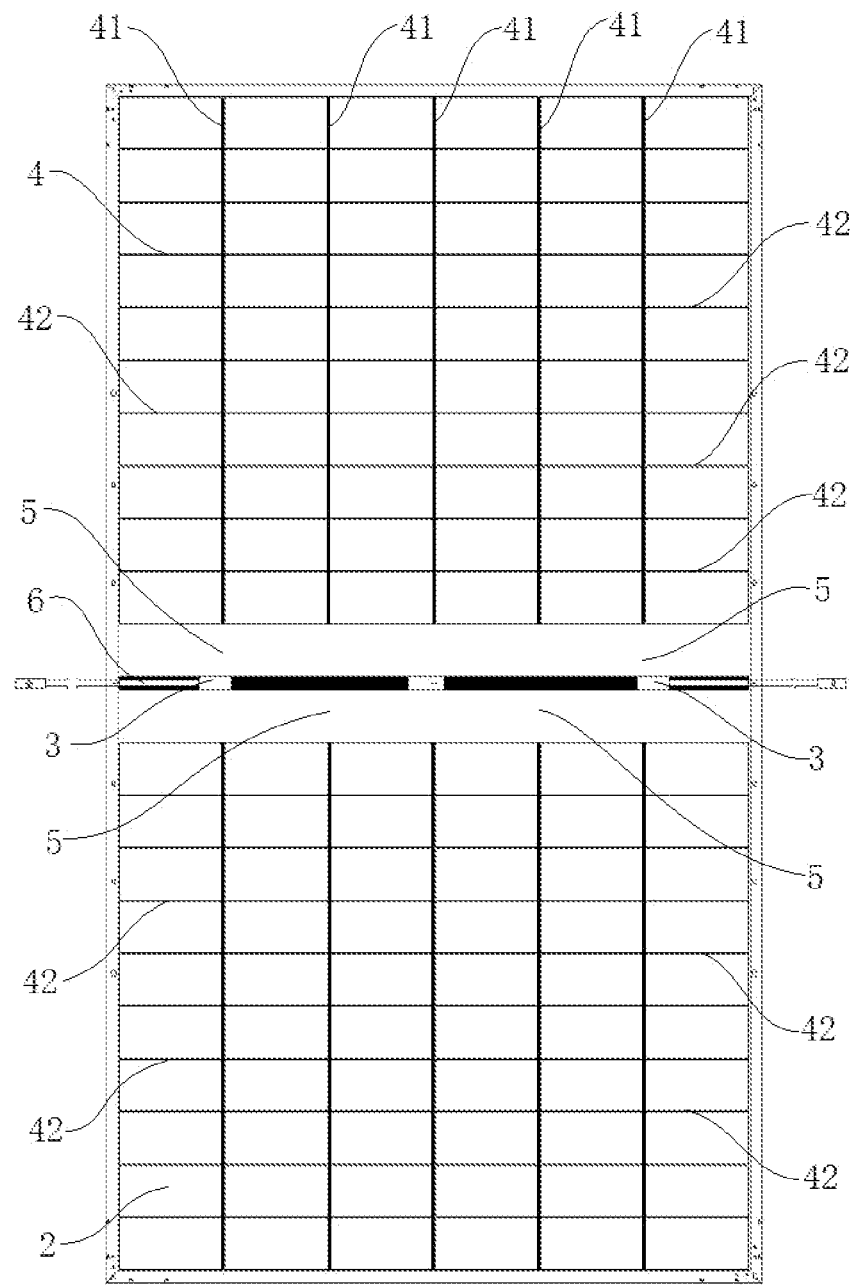
FIG. 1 is a schematic diagram illustrating a structure of a reflective layer according to an embodiment of the present disclosure.

100: Photovoltaic assembly; 10: Cell unit layer;
1: Cell unit; 11: Cell string; 111: Cell chip;
1111: First cell chip; 1112: Second cell chip;
12: Group of cell strings; 2: Backplate; 3: Junction box;
4: Reflective layer; 41: Longitudinal reflective strip; 411: Edge reflective strip;
412: Middle reflective strip; 413: Through-hole; 414: First reflective strip;
415: Second reflective strip; 42: First transverse reflective strip; 43: Second transverse reflective strip;
5: Opening; 6: Central bus; 7: Front-side transparent panel;
8: Front-side encapsulation film; 9: Encapsulation film.

DETAILED DESCRIPTION OF EMBODIMENTS

The embodiments of the present disclosure will be described in detail below with reference to examples thereof as illustrated in the accompanying drawings, throughout which same or similar elements, or elements having same or similar functions are denoted by same or similar reference numerals. The embodiments described below with reference to the drawings are illustrative only, and are intended to explain, rather than limiting, the present disclosure.

In the description of the present disclosure, it shall be understood that, terms such as "center", "upper", "lower", "front", "rear", "left", "right", "vertical", "horizontal", "top", "bottom", "inside", "outside" and others illustrating orientational or positional relations, are all on the basis of the orientational or positional relations illustrated in the drawings for convenience of simpleness of the description of the present disclosure, do not indicate or imply that the devices or elements must have a specific orientation or must be constructed and operated in a specific orientation, and thus cannot be construed as limiting the present disclosure.

It needs to be noted that, terms "first" and "second" are only for illustrative purposes and cannot be construed as indicating or implying relative importance or implicitly indicating the number of the illustrated technical features. Thus, features defined with "first" or "second" may implicitly or explicitly include one or more such features. Further, in the description of the present disclosure, "a plurality of" means two or more, unless otherwise specifically indicated.

The embodiments of the present disclosure will be described below in detail, and the embodiments described with reference to the drawings are exemplary, and the detailed description of the embodiments of the present disclosure will be given in the following.

A photovoltaic assembly 100 according to embodiments of the present disclosure will be described in the following with reference to FIG. 1~FIG. 6.

Figure 2:
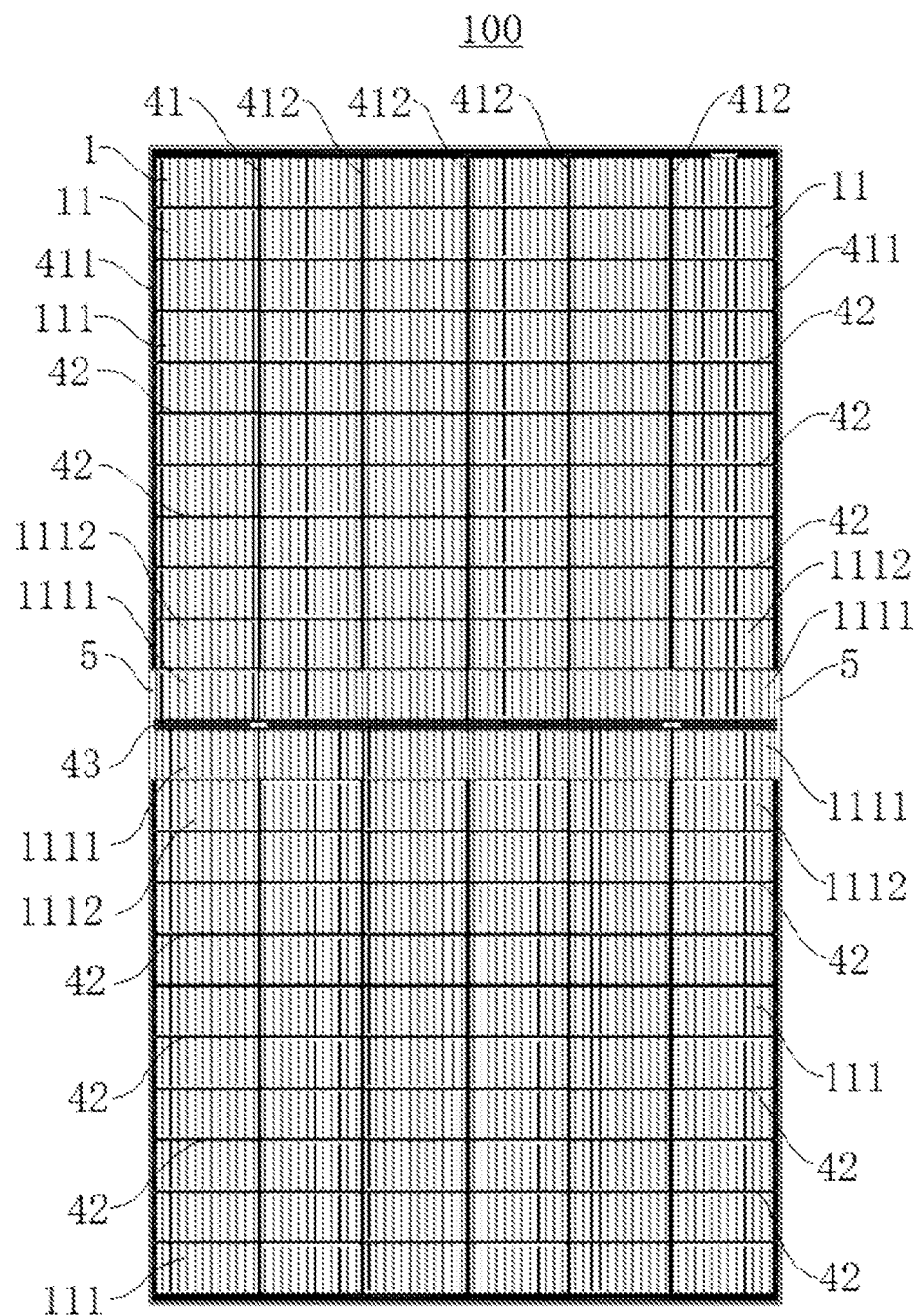
FIG. 2 is a front view schematically illustrating a structure of a photovoltaic assembly according to an embodiment of the present disclosure.

As illustrated in FIG. 2, an photovoltaic assembly 100 according to an embodiment of the present disclosure includes a cell unit layer 10, a backplate 2 and a reflective layer 4.

The cell unit layer 10 includes a plurality of cell units 1, each of the plurality of cell units 1 includes a plurality of cell strings 11, and each of the plurality of cell strings 11 includes a plurality of cell chips 111 that are connected in series and arranged in an arranging direction. The plurality of cell strings 11 are arranged in a direction vertical to the arranging direction of the plurality of cell chips 111 in each of the plurality of cell strings 11. The plurality of cell units 1 are arranged in the arranging direction of the plurality of cell chips 111 in each of the plurality of cell strings 11. In the description of the present disclosure, the term "plurality of" means two or more.

Here, it needs to be illustrated that, "the arranging direction" of the plurality of cell chips 111 in each of the plurality of cell strings may be understood as an arranging direction in which the plurality of cell chips 111 in each of the plurality of cell strings 11 are arranged, for example, the up-down direction in FIG. 1 and FIG. 2. In addition, the direction in which the plurality of cell strings are arranged is a direction vertical to the arranging direction of the plurality of cell chips 111 in each of the the plurality of cell strings, for example, the left-right direction in FIG. 1 and FIG. 2.

For example, FIG. 2 illustrates an example in which two cell units 1 are included. The two cell units 1 may be in parallel connection with each other. Each of the two cell units 1 includes six cell strings 11 that are serially connected. Each cell string 11 may include eleven cell chips 111 that are serially connected, and two adjacent cell chips 111 in each cell string 11 may be connected with each other via an irregularly-shaped solder strip. Optionally, the photovoltaic assembly 100 may include a front-side transparent panel 7, and the cell unit layer 10 may be provided under the front-side transparent panel 7. Here, the front side may mean a side where the main light-receiving surface of the cell chip 111 (i.e., a surface of the cell chip 111 or the photovoltaic assembly 100 that directly receives the solar light) is located, and the back side is a side opposite to the front side.

For illustrative purpose, FIG. 2 illustrates two cell units 1, each of the two cell units 1 includes six cell strings 11, and each of the six cell strings 11 includes eleven cell chips 111. However, a person skilled in the art may, after reading the technical solution of the disclosure, apply the technical solution to any other example in which another number of cell units 1, another number of cell strings 11 and another number of cell chips 111 are included, without departing from the protection scope of the present disclosure.

The backplate 2 is provided on the back side of the cell unit layer 10, at least one junction box 3 is provided on one side of the backplate 2 away from the cell unit layer 10, the junction box 3 is positioned between two adjacent cell units 1 of the the plurality of cell units 1, and the junction box 3 covers at least one cell chip 111 of at least one cell unit 1 of the plurality of cell units 1. For example, the junction box 3 may cover at least one cell chip 111 of one cell unit 1, or may cover at least one cell chip 111 in two adjacent cell units 1. Optionally, the backplate 2 may be a transparent plate such as glass plate, therefore both the front and back sides of the photovoltaic assembly 100 may effectively absorb and diffuse solar light so as to effectively improve the light production.

For example, in the example in FIG. 1 and FIG. 2, every two adjacent cell strings 11 along the direction in which the plurality of cell strings are arranged form one group 12 of cell strings, and each cell unit 1 includes three groups 12 of cell strings which are sequentially arranged along the direction in which the the plurality of cell strings are arranged. The number of the at least one junction box 3 is three, and each of the three junction boxes 3 is located between two cell strings 11 in a corresponding group 12 of cell strings. In this way, separate junction boxes 3 may reduce the number of cables and lower the junction temperature. Thus, by providing the above-mentioned junction boxes 3, the cables may be better protected, preventing foreign objects such as water or dusts from entering the junction boxes 3 and improving the reliability of the photovoltaic assembly 100.

The reflective layer 4 is provided between the cell unit layer 10 and the backplate 2. The reflective layer 4 includes a plurality of longitudinal reflective strips 41 which are separate from each other along the direction in which the plurality of cell strings are arranged. Each of the plurality of longitudinal reflective strips 41 extends in the arranging direction of the plurality of cell chips 111 in each of the plurality of cell strings, and each of the plurality of longitudinal reflective strips 41 covers edges of the cell chips 111 in at least one of the plurality of cell strings 11. For example, FIG. 2 illustrates an example in which seven longitudinal reflective strips 41 are arranged to be uniformly spaced from each other along the direction in which the plurality of cell strings are arranged. In this way, by providing the above-mentioned reflective layer 4, most of the solar light incident onto the front side of the photovoltaic assembly 100 can be prevented from being transmitted, thereby improving the power at the front side of the photovoltaic assembly 100 so as to improve efficiently solar light utilization, and improving the power and utilization of both sides of the photovoltaic assembly 100. Further, since each of the longitudinal reflective strips 41 covers edges of the cell chips 111 in at least one cell string 11, the photovoltaic assembly 100 can be adequately covered to further improve its power, preventing solar light from being transmitted through the gaps between the edges of the cell strings 11 and the longitudinal reflective strip 41.

At least one of the plurality of longitudinal reflective strips 41 is broken at a location adjacent to the cell chip 111 covered by the junction box 3 to form at least one opening 5. For example, for a photovoltaic assembly in the prior art, when the longitudinal reflective strip 41 covers a cell string 11, the longitudinal reflective strip 41 may cover all the cell chips 111 in the cell string 11, causing the cell chip 111 covered by the junction box 3 to be excessively covered, which may consume the produced energy of other cell chips 111 in the cell unit 1 that are not covered by the junction box 3, and the part covered by the junction box may have a higher temperature and thus is subject to a hot-spot.

Thus, at least one of the plurality of longitudinal reflective strips 41 is arranged to be broken at a location adjacent to the cell chip 111 covered by the junction box 3 so as to form at least one opening 5, in comparison with the existing photovoltaic assembly, the opening 5 can prevent the cell chip 111 covered by the junction box from being covered by the longitudinal reflective strip, so as to effectively reduce current mismatch of the cell chip 111, to improve the long-term reliability of the photovoltaic assembly 100, and to guarantee utilization of both sides of the photovoltaic assembly 100. Besides, the opening 5 may reduce the area of the reflective layer 4 and thus to reduce the auxiliary material amount of the backplate 2, thereby lowering the cost.

In the photovoltaic assembly 100 according to embodiments of the present disclosure, the cell unit layer 10, the backplate 2 and the reflective layer 4 including a plurality of longitudinal reflective strips 41 are provided, each of the plurality of longitudinal reflective strips 41 is arranged to cover edges of the cell chips 111 in at least one cell string 11, and at least one of the plurality of longitudinal reflective strips 41 is provided to be broken at a location adjacent to the cell chip 111 covered by the junction box 3 to form at least one opening 5. In this way, on one hand, the opening 5 may avoid covering the cell chip 111 so as to effectively reduce the current mismatch of the cell chip 111 and to guarantee the reliability of the photovoltaic assembly 100, and on the other hand, the material cost of the photovoltaic assembly 100 can be lowered.

In some embodiments of the present disclosure, referring to FIG. 1 and FIG. 2, the opening 5 is located at a cell chip 111 covered by the junction box 3. The light-receiving area of the cell chip 111 covered by the junction box 3 in the cell unit 1 is equal to a light-receiving area of each of other cell chips 111 in the cell unit 1. In this way, the area of the cell chip 111 that is covered by the junction box 3 may be equal to the area of each of other cell chips 111 in the cell unit 1 that is covered by the longitudinal reflective strip 41, so as to allow the light-receiving area of all the cell chips 111 in the cell unit 1 which is covered by the junction box 3 to be equal, thereby avoiding current mismatch in the cell chip 111 and improving the long-term reliability of the photovoltaic assembly 100.

In some embodiments of the present disclosure, referring to FIG. 2, two adjacent cell chips 111 in each cell string 11 that are adjacent to the junction box 3 are a first cell chip 1111 and a second cell chip 1112 respectively. The second cell chip 1112 is located at one side of the first cell chip 1111 that is away from the junction box 3. Two adjacent cell units 1 are a first cell unit and a second cell unit respectively. The opening 5 has one end located between the first cell chip 1111 and the second cell chip 1112 of a cell string 11 of the first cell unit, and another end located between the first cell chip 1111 and the second cell chip 1112 of of a cell string of the second cell unit.

For example, referring to FIG. 1 and FIG. 2, two adjacent cell chips 111 in each cell string 11 may be provided spaced apart from each other. In this case, the one end of the opening 5 may be flush with an edge of the first cell chip 1111 of the first cell at one side that is adjacent to the second cell chip 1112, or may be located at a gap between the first cell chip 1111 and the second cell chip 1112 of the first cell unit, or may be flush with an edge of the second cell chip 1112 of the first cell unit at one side that is adjacent to the first cell chip 1111. In a similar way, the other end of the opening 5 may be flush with an edge of the first cell chip 1111 of the second cell unit at one side that is adjacent to the second cell chip 1112, or may be flush with an edge of the second cell chip 1112 of the second cell unit at one side that is adjacent to the first cell chip 1111, or may be located at a gap between the first cell chip 1111 and the second cell chip 1112 of the second cell unit. Thus, with the above configuration, a whole first cell chip 1111 covered by the junction box 3 may be in correspondence to an opening 5, so as to allow the first longitudinal reflective strip 41 to completely avoid the first cell chip 1111 covered by the junction box 3. In this way, it allows the opening 5 to effectively balance the cover of the first cell chip 1111 by the junction box 3 so as to allow the covered area of each of all the cell chips 111 in the cell unit 1 to be uniform, and guarantee utilization of both sides of the photovoltaic assembly 100.

For convenience of illustration, the above-mentioned opening 5, which has one end located between the first cell chip 1111 and the second cell chip 1112 of the cell string 11 of the first cell unit and another end located between the first cell chip 1111 and the second cell chip 1112 of the cell string 11 of the second cell unit, is termed as a first opening herein. It needs to be noted that, when a plurality of openings 5 are included and the plurality of openings 5 include a first opening, each of all the openings 5 may be a first opening, or some of the plurality of openings 5 may be first openings.

In a further embodiment of the present disclosure, referring to FIG. 1 and FIG. 2, each of the longitudinal reflective strips 41 has an opening 5. For example, FIG. 1 and FIG. 2 illustrates an example in which seven openings 5 are included. Each of the seven openings 5 is a first opening, and the ends of the seven openings 5 that are located on the same side of the junction box 3 may be flush with each other. Thus, with the above configuration, each of all the first cell chips 1111 in each cell unit 1 can avoid from being covered by the longitudinal reflective strips 41, so as to allow the area covered by the junction box 3 in each first cell chip 1111 to be the same with the area covered by the longitudinal reflective strip 41 in each of other cell chips 111 in the same cell unit 1. In this way, it can effectively lower current mismatch of the cell chip 111 and guarantee the output power of the photovoltaic assembly 100.

In some embodiments of the present disclosure, the cell chip 111 has a width D in the arranging direction of the plurality of cell chips 111 in each of the plurality of cell strings, and a portion of the opening 5 that is in the first cell unit has a length d, and d and D satisfy d=D and $82 \text{ mm} \leq D \leq 120 \text{ mm}$. Thus, by d=D, the opening 5 may face the cell chip 111 in the first cell unit that is covered by the junction box 3, so as to allow all the cell chips 111 in the first cell unit to have a same light-receiving area and guarantee the reliability of the photovoltaic assembly 100. In addition, by allowing $2 \text{ mm} \leq D \leq 120 \text{ mm}$, the cell chip 111 can be a half of a whole cell chip 111, so as to reduce internal loss, improve the output power of the photovoltaic assembly 100, help to reduce cost per Watt, and facilitate the processing of the cell chip 111.

In some embodiments of the present disclosure, referring to FIG. 2, the plurality of longitudinal reflective strips 41 include two edge reflective strips 411 and at least one middle reflective strip 412. The two edge reflective strips 411 are located at edges of the cell unit layer 10 in the direction in which the plurality of cell strings are arranged, each of the two edge reflective strips 411 covers the edges of the cell chips 111 in the corresponding cell string 11, the middle reflective strip 412 is located between the two edge reflective strips 411, and the middle reflective strip 412 is located between two adjacent cell strings 11 and covers the edges of the cell chips 111 in the two adjacent cell strings 11. For example, FIG. 2 illustrates an example in which seven longitudinal reflective strips 41 including two edge reflective strips 411 and five middle reflective strips 412 are included. Each edge reflective strip 411 has a width larger than that of each middle reflective strip 412. Since there is an electric clearance at the edge of the cell unit layer 10 to guarantee the security of the photovoltaic assembly 100, a larger width of the edge reflective strip 411 may effectively cover the electric clearance. Thus, by providing the above-mentioned edge reflective strips 411 and middle reflective strips 412, the edge reflective strips 411 may reduce transmittance of solar light at the edge of the cell unit layer 10 in the direction in which the plurality of cell strings are arranged, and the middle reflective strips 412 may reduce transmittance of solar light at the gap between two adjacent cell strings 11, thereby improving the optical utilization of the photovoltaic assembly 100, guaranteeing the uniformity of physical appearance of the photovoltaic assembly 100 and allowing the physical appearance of the photovoltaic assembly 100 to be more uniform and visually pleasing.

It needs to be illustrated that, the term "electric clearance" means a minimum spatial distance measured between two conductive parts or between a conductive part and a protection interface of a device, i.e., a minimum distance capable of achieving air insulation on a premise of high electrical stability and high security.

In a further embodiment of the present disclosure, as illustrated in FIG. 1 and FIG. 2, the reflective layer 4 further includes a plurality of first transverse reflective strips 42. The plurality of first transverse reflective strips 42 are spaced apart from each other along the arranging direction of the plurality of cell chips 111 in each of the plurality of cell strings and are connected between the two edge reflective strips 411. Each of the plurality of the first transverse reflective strips 42 extends along the direction in which the plurality of cell strings are arranged and covers edges of corresponding cell chips 111. For example, in an example illustrated in FIG. 2, two edge reflective strips 411 may be a first edge reflective strip and a second edge reflective strip respectively. The plurality of first transverse reflective strips 42 include two edge transverse reflective strips and a plurality of middle transverse reflective strips. The plurality of middle transverse reflective strips are located between the two edge transverse reflective strips. One of the two edge transverse reflective strips has one end connected with one end of the first edge reflective strip and another end connected with one end of the second edge reflective strip. The other of the two edge transverse reflective strips has one end connected with the one end of the first edge reflective strip and another end connected with the other end of the second edge reflective strip. Each edge transverse reflective strip has a width greater than that of the middle transverse reflective strip to cover the electric clearance. In this way, by providing the plurality of first transverse reflective strips 42, transmittance of solar light at the edges of the cell unit layer 10 along the arranging direction of the plurality of cell chips 111 in each of the plurality of cell strings and/or at the gap between two adjacent cell chips 111 in each of the plurality of cell strings 111 may be reduced, thereby further improving the utilization of the solar light and improving the power and utilization of both sides of the photovoltaic assembly 100.

In some embodiments of the present disclosure, referring to FIG. 1 and FIG. 2, in each cell unit 1, a first transverse reflective strip 42 is provided between every two adjacent cell chips 111 along the arranging direction of the plurality of cell chips 111 in each of the plurality of cell strings, and the first transverse reflective strip 42 covers edges of two corresponding adjacent cell chips 111 in all of the cell strings 11. In this way, the gap between two adjacent cell chips 111 in the cell string 11 of the photovoltaic assembly 100 can be prevented effectively from getting exposed, and the solar light incident onto the front side of the photovoltaic assembly 100 can be effectively prevented from getting transmitted from the gap between two adjacent cell chips 111 in the cell string 11, thereby effectively improving the power at the front side of the photovoltaic assembly 100 and uniformity of physical appearance of the photovoltaic assembly 100.

Optionally, referring to FIG. 1 and FIG. 2, each of the plurality of first transverse reflective strips 42 may have a width smaller than that of each of the plurality of longitudinal reflective strips 41. In this way, by reducing the width of the first transverse reflective strip 42, the auxiliary material amount of the backplate 2 on the back side may be further reduced, and thus the cost of the photovoltaic assembly 100 may be further reduced. In addition, the gap between two adjacent cell chips 111 in each cell string 11 can be reduced, so as to allow the arrangement of the cell chips 111 to be more compact and to allow the arrangement of more cell chips 111 in a limited space, which effectively improves the output power of the photovoltaic assembly 100.

It needs to be illustrated that, the term "each of the plurality of first transverse reflective strips 42" may be understood as each first transverse reflective strip 42 (i.e., each middle transverse strip) between two adjacent cell chips 111. It can be understood that, each edge transverse reflective strip has a width equal to or greater than that of the longitudinal reflective strip 41.

In some optional embodiments of the present disclosure, the first transverse reflective strip 42 has a width $W_1$, and $W_1$ satisfies $0\ mm < W_1 \leq 6\ mm$. For example, when $W_1 > 6\ mm$, each first transverse reflective strip 42 has an overlarge width, which may cause an overlarge covered area of the corresponding cell chip 111 and increase the cost of the photovoltaic assembly 100. In this way, by allowing $W_1$ to satisfy $0\ mm < W_1 \leq 6\ mm$, it can effectively avoid the cell chip 111 from being covered excessively, reduce the cost, and at the same time guarantee the solar light utilization of the photovoltaic assembly 100 and improve the output power of the photovoltaic assembly 100.

In some embodiments of the present disclosure, referring to FIG. 2, the reflective layer 4 further includes a second transverse reflective strip 43. The second transverse reflective strip 43 is located between two adjacent cell units 1. The second transverse reflective strip 43 extends along the direction in which the plurality of cell strings are arranged. The second transverse reflective strip 43 covers edges of adjacent cell chips 111 in the two adjacent cell units 1. For example, referring to FIG. 1 and FIG. 2, when the photovoltaic assembly 100 is observed from the front side, the second transverse reflective strip 43 has a width equal to the width of the gap between two adjacent cell units 1, and the plurality of first cell chips 1111 of the two cell units 1 cover the corresponding edge of the second transverse reflective strip 43. When the photovoltaic assembly 100 is observed from the back side, the second transverse reflective strip 43 has a width greater than the width of the gap between two adjacent cell units 1 and the second transverse reflective strip 43 covers the edges of the plurality of first cell units 1111 of the two cell units 1. In this way, by providing the above-mentioned second transverse reflective strip 43, the solar light incident onto the front side of the photovoltaic assembly 100 can be prevented from getting transmitted from the gap between the two adjacent cell units 1, which can improve the solar light utilization and the power of the photovoltaic assembly 100 at the front side.

In some optional embodiments of the present disclosure, as illustrated in FIG. 2, the second transverse reflective strip 43 has a width greater than that of each first transverse reflective strip 42, and the second transverse reflective strip 43 has a width greater than that of each longitudinal reflective strip 41. Thus, since the junction box 3 is provided between two adjacent cell units 1, by allowing the width of the second transverse reflective strip 43 to be greater than the width of each of the first transverse reflective strip 42 and the longitudinal reflective strip 41, an enough gap may be preserved between two adjacent cell units 1 to place a junction box 3, so as to avoid the cell chips 111 from being covered excessively by the junction box 3. In addition, it can be guaranteed that the second transverse reflective strip 43 covers the edges of corresponding cell chips 111 to guarantee the front-side power of the photovoltaic assembly 100.

In some embodiments of the present disclosure, referring to FIG. 1 and FIG. 2, the cell unit layer 10 is provided with a central bus 6 located between two adjacent cell units 1. The two adjacent cell units 1 are connected in parallel through the central bus 6. The central bus 6 extends along the direction in which the plurality of cell strings are arranged, and has a width smaller than that of the second transverse reflective strip 43.

For example, in the example illustrated in FIG. 1, the central bus 6 may have a width smaller than the width of the gap between two adjacent cell units 1. The central bus 6 may include a first lead-out section, a second lead-out section and two central bus sections. The first lead-out section, the two central bus sections, and the second lead-out section are sequentially arranged along the direction in which the plurality of cell strings are arranged. Two adjacent cell strings 11 in two adjacent groups 12 of cell strings located on the same side of the central bus 6 are serially connected with each other through a corresponding central bus section, and two cell strings 11 which are located on different sides of the central bus 6 along the arranging direction of the plurality of cell chips 111 in each of the plurality of cell strings are connected in parallel through a corresponding central bus section. The three junction boxes 3 are located between the first lead-out section and its adjacent central bus section, between the two adjacent central bus sections, and between the second lead-out section and its adjacent central bus section respectively. In this way, by providing the above-mentioned central bus 6, parallel connection between two adjacent cell units 1 can be realized, thereby lowering difficulty level in design and process and simplifying the structure.

Figure 5:
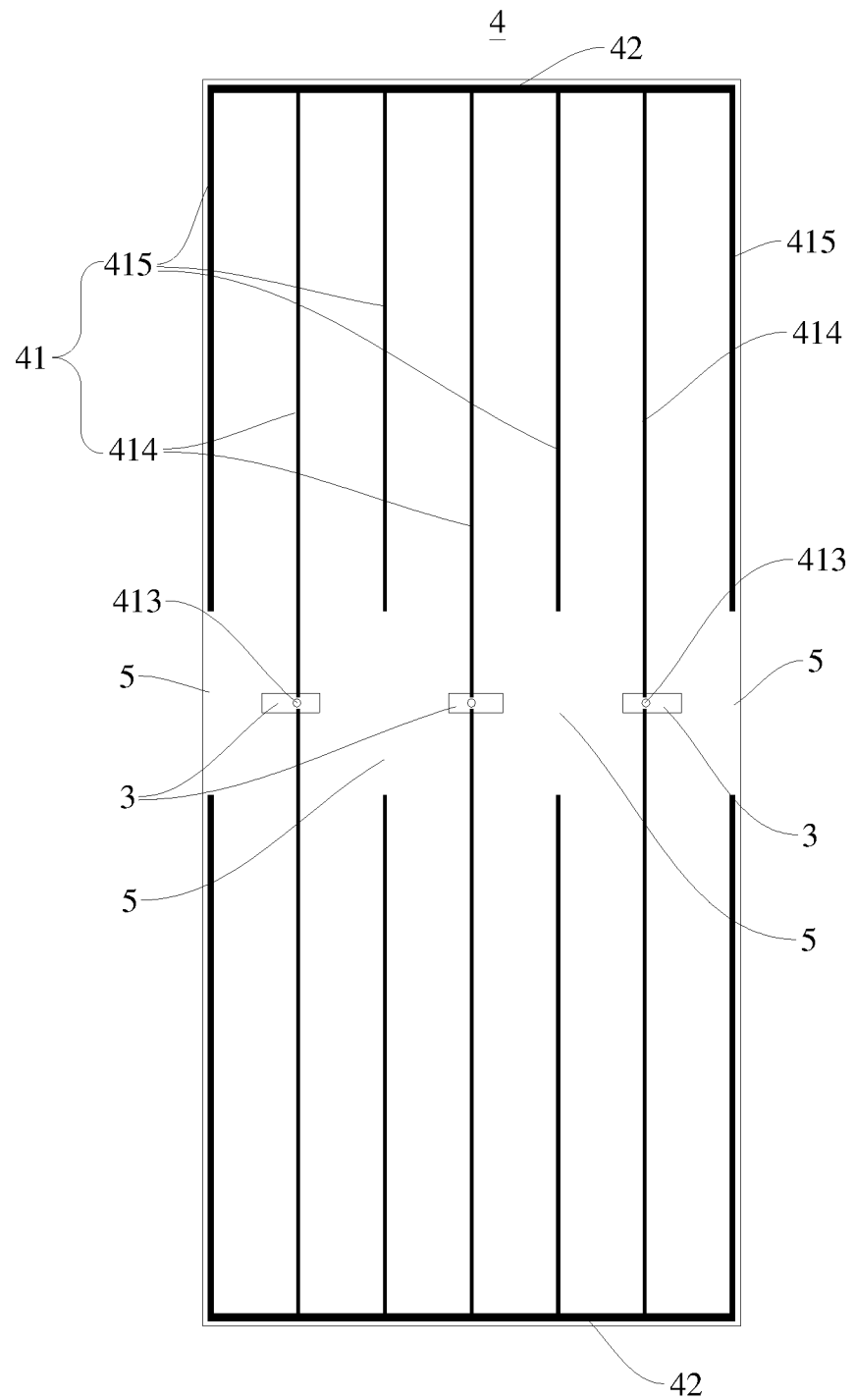
FIG. 5 is a schematic diagram illustrating a structure of a reflective layer according to another embodiment of the present disclosure.
Figure 6:
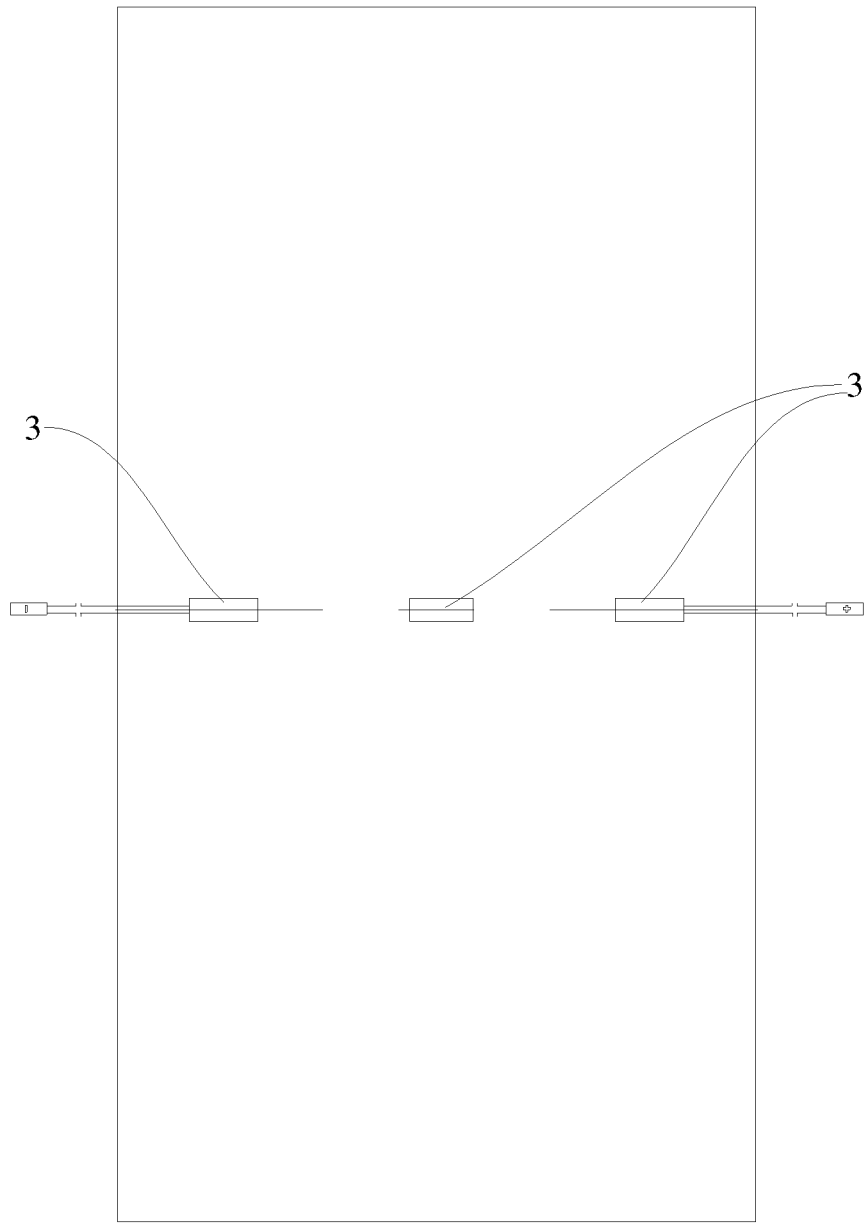
FIG. 6 is a schematic diagram illustrating a photovoltaic assembly viewed from another angle according to an embodiment of the present disclosure.

Optionally, referring to FIG. 5 and FIG. 6, the junction box 3 may face one of the plurality of longitudinal reflective strips 41, and the one of the plurality of longitudinal reflective strip 41 may be formed with an above-mentioned opening 5. The opening 5 may be a through hole 413 for a wire to pass through, and the through hole 413 faces towards the junction box 3. In this way, by providing the above-mentioned through hole 413, on one hand, the through hole 413 can avoid the cell chip 111 from being covered, so as to reduce the total area of the cell chip 111 that is covered by the junction box 3 and lower current mismatch of the cell chip 111. On the other hand, the through hole 413 may allow the junction box 3 to conduct out the current produced in the photovoltaic assembly 100 for user's use and protect the photovoltaic assembly 100 at the same time.

In some specific embodiments of the present disclosure, as illustrated in FIG. 5 and FIG. 6, the plurality of longitudinal reflective strips 41 include a plurality of first reflective strips 414 and a plurality of second reflective strips 415. One first reflective strip 414 is provided between two adjacent reflective strips 415. A plurality of junction boxes 3 are included, the plurality of junction boxes 3 are in one-to-one correspondence with the plurality of first reflective strips 414. Each of the plurality of second reflective strips 415 is provided with the opening 5.

For example, in an example illustrated in FIG. 5 and FIG. 6, the photovoltaic assembly 100 adopts a design with three separate junction boxes 3, that is, three junction boxes 3 are included. The reflective layer 4 includes seven longitudinal reflective strips 41 including three first reflective strips 414 and four second reflective strips 415. The three first reflective strips 414 and the four second reflective strips 415 are provided in an alternate way. The three junction boxes 3 face towards the three first reflective strips 414. Each of the four second reflective strips 415 is broken to form an opening 5, that is, four openings 5 are formed. In this way, by allowing each of the second reflective strips 415 to have an opening 5, it can be guaranteed that all the cell chips 111 in the cell unit 1 covered by the junction box 3 have a uniform covered area, thereby effectively avoiding the reliability risk caused by the junction box 3 covering the cell chip 111 at the back side.

Optionally, each of the plurality of first reflective strips 414 is provided with an opening 5 (not illustrated in the drawings), and the opening 5 of the first reflective strip 414 has a length smaller than that of the opening 5 of the second reflective strip 415. In this way, the opening 5 of the first reflective strip 414 may also avoid the cell chip 111 from being covered, thereby further guaranteeing that all the cell chips 111 in the cell unit 1 covered by the junction box 3 have a same area and that the reliability of the photovoltaic assembly 100 is high.

In some embodiments of the present disclosure, the opening 5 has a length L, and L satisfies 0 mm<L ≤500 mm. In this way, by allowing L to satisfy 0 mm<L ≤500 mm, the opening 5 has a proper length, which can guarantee that all the cell chips 111 in the cell unit 1 covered by the junction box 3 have a same covered area and the power of the photovoltaic assembly 100 can be higher.

In a further embodiment of the present disclosure, L further satisfies 100 mm<L≤300 mm. Particularly, for example, when L<100 mm, the opening 5 has a too small length, the cell chip 111 covered by the junction box 3 may have a region with an excessive area that is covered by the longitudinal reflective strip 41, thus the light-receiving area of the cell chip 111 covered by the junction box 3 is smaller than the light-receiving area of each of other cell chips 111 in the cell unit 1, which generates a current mismatch. When L>300 mm, the opening 5 has a too large length, and the length of the longitudinal reflective strip 41 apart from the opening 5 may be too small, thereby possibly lowering the power of the photovoltaic assembly 100. In this way, by allowing L to satisfy 100 mm<L ⩽300 mm, the opening 5 has a proper length, therefore all the cell chips 111 in the cell unit 1 that is covered by the junction box 3 can have a same light-receiving area, and the output power of the photovoltaic assembly 100 can be further improved.

In some embodiments of the present disclosure, a distance d between two adjacent cell chips 111 in each cell string 11 satisfies 0 mm≤d≤2 mm. For example, when the distance d=0 mm, the distance between two adjacent cell chips 111 in the same cell string 11 is zero, that is, two adjacent cell chips 111 in each cell string 11 are connected without any gap. When d=2 mm, the distance between two adjacent cell chips 111 in one same cell string 11 is 2 mm, and the plurality of cell chips 111 in each cell string 11 are provided spaced apart from each other. When 0 mm<d<2 mm, two adjacent cell chips 111 in one same cell string 11 are connected to each other with a small gap. In this way, by allowing the distance d to satisfy 0 mm≤d≤2 mm, two adjacent cell chips 111 in each cell string has no gap or a small gap therebetween, the arrangement of the plurality of cell chips 111 is more compact, thereby facilitating electrical connection between adjacent cell chips 111. The photovoltaic assembly 100 can have a smaller size, thereby improving the efficiency of the photovoltaic assembly 100 and lowering the auxiliary material cost of the photovoltaic assembly 100.

Optionally, each longitudinal reflective strip 41 has a width $W_2$, and $W_2$ satisfies 2 mm-$W_2$≤15 mm. For example, when $W_2$<2 mm, each longitudinal reflective strip 41 has a too small width, and the gap between two adjacent cell strings 11 cannot be fully covered, which lowers the power of the photovoltaic assembly 100. When $W_2$>15, each longitudinal reflective strip 41 may have a too large width, causing the cell chip 111 to have a region with excessively large area to be covered. In this way, by allowing the $W_2$ to satisfy 2 mm ⩽ $W_2$ ⩽ 15 mm, it can effectively avoid the cell chip 111 from being excessively covered and guarantee a relatively high power of the photovoltaic assembly 100. Optionally, $W_2$ may further satisfy 2 mm ⩽ $W_2$ ⩽ 10 mm, but is not limited to this.

In some embodiments of the present disclosure, referring to FIG. 2 and FIG. 5, each of the outermost two first transverse reflective strips 42 along the arranging direction of the plurality of cell chips 111 in each of the plurality of cell strings may have a width greater than the width of each of the middle reflective strips 412. For example, in the example illustrated in FIG. 2 and FIG. 5, each of the two edge transverse reflective strips has a width greater than that of each of the middle reflective strips 412. Since the outermost two first transverse reflective strips 42 along the arranging direction of the plurality of cell chips 111 in each of the plurality of cell strings are located at the edges of the cell unit layer, the outermost two first transverse reflective strips 42 along the arranging direction of the plurality of cell chips 111 in each of the plurality of cell strings may cover the above-mentioned electric clearance, thereby guaranteeing the solar light utilization of the photovoltaic assembly 100.

Optionally, the reflective layer 4 may be a reflective coating layer (not illustrated in the drawings) applied on one side surface of the backplate 2 that is nearer to the cell unit layer 10. In this way, the reflective layer 4 may improve both the front-side power and the back-side power of the photovoltaic assembly 100 so as to improve the utilization of both sides of the photovoltaic assembly 100. In addition, the reflective layer 4 and the backplate 2 are integrally formed, thereby facilitating the manufacture process.

Figure 4:
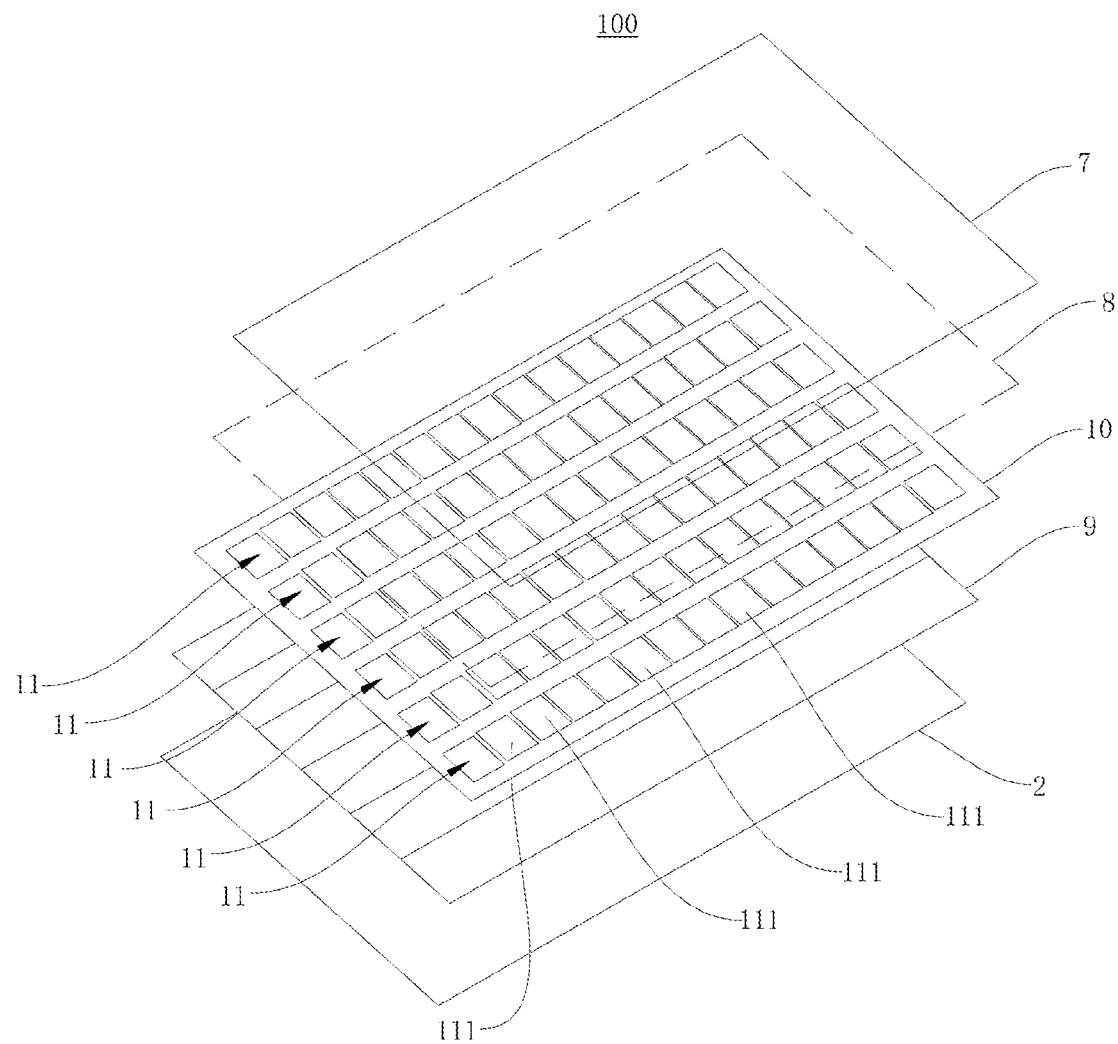
FIG. 4 is a schematic exploded view illustrating a structure of a photovoltaic assembly according to an embodiment of the present disclosure.

Alternatively, as illustrated in FIG. 4, an encapsulation film 9 is provided between the backplate 2 and the cell unit layer 10, and the reflective layer 4 is provided on the encapsulation film 9. Particularly, the reflective layer 4 may be embedded into the encapsulation film 9, and a surface of the reflective layer 4 is flush with one side surface of the encapsulation film 9 in the thickness direction thereof. For example, white polymer material can be incorporated, with the shape of the reflective layer 4 as a template, into transparent polymer material. The encapsulation film 9 may be made of one or more of ethylene vinyl acetate, polyolefin and polyethylene foam. In this way, the reflective layer 4 and the encapsulation film 9 have no thickness difference therebetween, thereby effectively avoiding the problem of crack of the laminate of the photovoltaic assembly 100 and improving the yield rate of the photovoltaic assembly 100.

Of course, the present disclosure is not limited thereto. The reflective layer 4 may be adhesively connected to the backplate 2 by an adhesive. For example, in the case that the backplate 2 is made of glass, when a through hole 413 is being formed in the longitudinal reflective strip 41, the backplate 2 is liable to burst. Therefore, the reflective layer 4 can be processed in advance, and then the reflective layer 4 can be adhered to the backplate 2. In this way, it is possible to avoid affecting the structural strength of the backplate 2, thereby guaranteeing the structural stability of the photovoltaic module 100.

Of course, the reflective layer 4 may be printed on one side surface of the encapsulation film 9. It should be understood by a person skilled in the art that, the manufacturing process of the reflective layer 4 may be not limited to any particular way, as long as the reflective layer 4 is guaranteed to be on the back side of the cell unit layer 10.

Optionally, the reflective layer 4 may be made from titanium dioxide, white glaze or white polymer material. In this way, the backplate 2 or the encapsulation film 9 may be provided thereon with a white reflective layer 4, so as to improve the solar light utilization, to improve the power and utilization of both sides of the photovoltaic assembly 100, and to improve the back-side power gain of the double-glazed photovoltaic assembly 100. Of course, the reflective layer 4 may be made from other material similar to white glaze, which is not limited herein.

Figure 3:
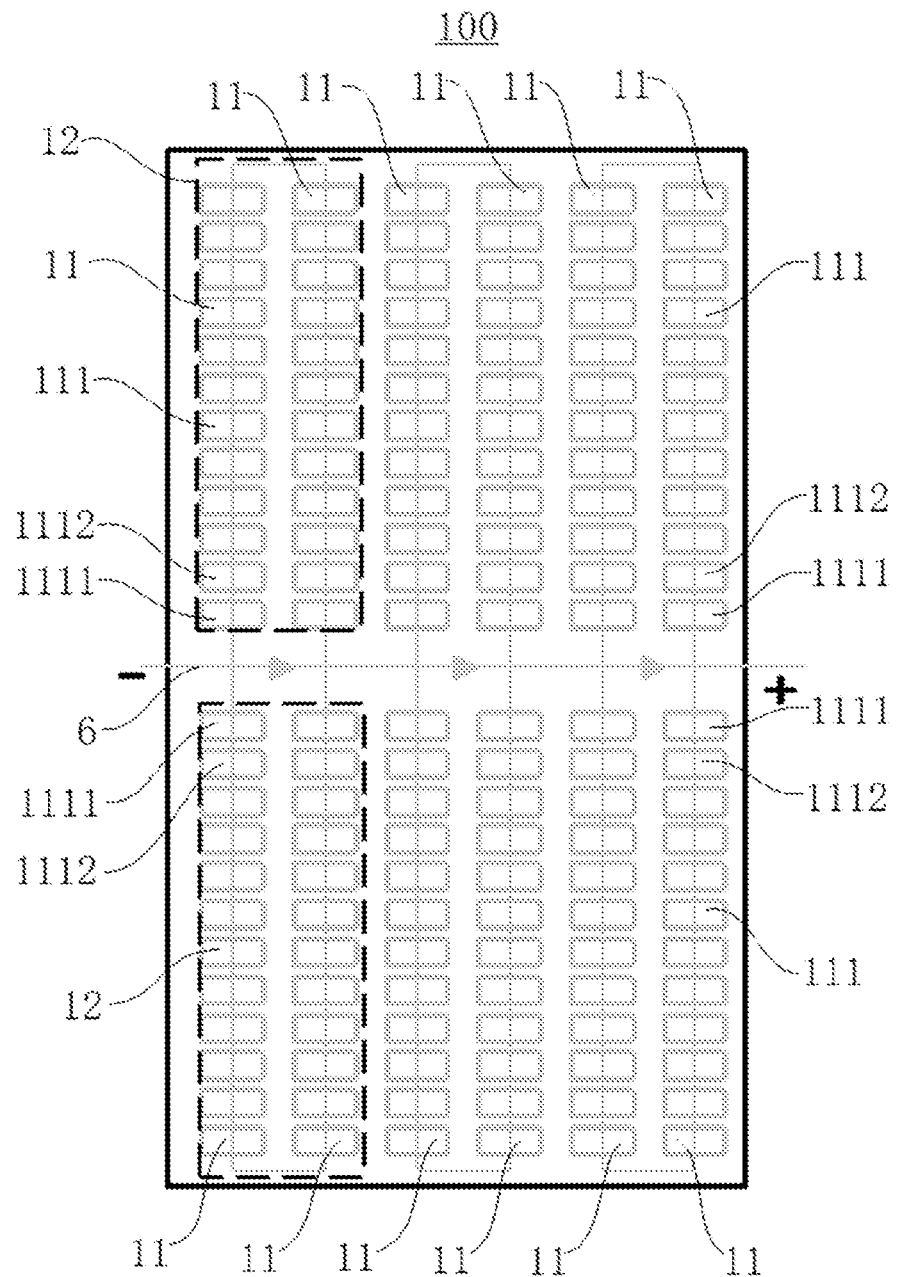
FIG. 3 is a schematic diagram illustrating a circuit of a photovoltaic assembly according to an embodiment of the present disclosure.

Optionally, the photovoltaic assembly 100 may be a symmetric structure which is symmetric along the arranging direction of the plurality of cell chips 111 in each of the plurality of cell strings. For example, in the example as illustrated in FIG. 2 and FIG. 3, the photovoltaic assembly 100 may be a symmetric structure in the up-down direction. The photovoltaic assembly 100 may be symmetric in the left-right direction (as illustrated in FIG. 2 and FIG. 3) or asymmetric in the left-right direction, as long as the photovoltaic assembly 100 is a structure that is symmetric in the up-down direction. Thus, by forming the photovoltaic assembly 100 into a symmetric structure, the structure is simplified and convenient to manufacture, and provides a better physical appearance.

In some optional embodiments of the present disclosure, each longitudinal reflective strip 41 has a length a, the maximum distance between two cell chips 111 farthest from each other along the arranging direction of the plurality of cell chips 111 in each of the plurality of cell strings is b, and a and b satisfy $0.7 \leq a/b \leq 1.3$. Particularly, for example, when a/b=0.7, the length of the longitudinal reflective strip 41 is smaller than the maximum distance between two cell chips 111 farthest from each other along the arranging direction of the plurality of cell chips 111 in each of the plurality of cell strings, for example the longitudinal reflective strip 41 may have an opening 5. When a/b=1.3, the length of the longitudinal reflective strip 41 is greater than the maximum distance between two cell chips 111 farthest from each other along the arranging direction of the plurality of cell chips 111 in each of the plurality of cell strings, then at least one end of the longitudinal reflective strip 41 extends beyond the outermost edge of at least one of the two cell chips 111 farthest from each other along the arranging direction of the plurality of cell chips 111 in each of the plurality of cell strings. Through the above configuration, the photovoltaic assembly 100 can be guaranteed to have a higher solar light utilization.

The manufacturing process of the photovoltaic assembly 100 will be described below with reference to FIG. 4.

As illustrated in FIG. 4, the encapsulation film 9 is an encapsulation film 9 at the back side. The photovoltaic assembly 100 includes a front-side transparent panel 7, a front-side encapsulation film 8, a cell unit layer 10, an encapsulation film 9 and a backplate 2 sequentially from the top to the bottom. When manufacturing the photovoltaic assembly 100, the front-side transparent panel 7, the front-side encapsulation film 8, the cell unit layer 10, the encapsulation film 9 and the backplate 2 are sequentially placed to be prepared for lamination of the double-glazed photovoltaic assembly 100. Then the five-layered structure including the front-side transparent panel 7, the front-side encapsulation film 8, the cell unit layer 10, the encapsulation film 9 and the backplate 2 which are sequentially placed is subject to a vacuum draw process and a thermal lamination process, to cross-link and solidify the front-side encapsulation film 8 and the encapsulation film 9, so as to provide protection for the cell unit layer 10 and finally achieve a firm adhesion of the five-layered structure (i.e., the front-side transparent panel 7, the front-side encapsulation film 8, the cell unit layer 10, the encapsulation film 9 and the backplate 2). Then, an aluminium alloy frame (not illustrated in the drawings) and the junction boxes 3 are installed, and silica gel is applied to achieve sealing, and finally the manufacturing of the photovoltaic assembly 100 is finished.

The photovoltaic assembly 100 according to embodiments of the present disclosure may have other configurations and operations which are known to a person skilled in the art and will be not described in detail here.

In the description of the present disclosure, the description with reference to the terms "one embodiment", "some embodiments", "exemplary embodiments", "example", "specific example", or "some examples", etc., means that specific features, structures, materials, or characteristics described in conjunction with the embodiment(s) or example(s) are included in at least one embodiment or example of the present disclosure. In the present disclosure, any illustrative reference of the above terms does not necessarily refer to the same embodiment(s) or example(s). In addition, specific characteristics, structures, materials or features described may be combined in a suitable manner in any one or more embodiments or examples.

Although the embodiments of the present disclosure have been shown and described above, it can be appreciated by those of ordinary skill in the art that various changes, modifications, replacements and variations can be made to the above embodiments without departing from the principle and the spirit of the present disclosure. The scope of the disclosure is defined by claims and equivalents thereof.

What is claimed is:

1. A double-glazed photovoltaic assembly, comprising:
a cell unit layer comprising a plurality of cell units, each of the plurality of cell units comprising a plurality of cell strings, each of the plurality of cell strings comprising a plurality of cell chips that are connected in series and arranged in an arranging direction, the plurality of cell strings being arranged in a direction vertical to the arranging direction of the plurality of cell chips in each of the plurality of cell strings, and the plurality of cell units being arranged in the arranging direction of the plurality of cell chips in each of the plurality of cell strings;
a backplate provided on a back side of the cell unit layer, one side of the backplate away from the cell unit layer being provided with at least one junction box, the junction box being positioned between two adjacent cell units of the plurality of cell units, and the junction box covering at least one cell chip of at least one cell unit of the plurality of cell units; and
a reflective layer provided between the cell unit layer and the backplate, the reflective layer comprising a plurality of longitudinal reflective strips, the plurality of longitudinal reflective strips being separate from each other along the direction in which the plurality of cell strings are arranged, each of the plurality of longitudinal reflective strips extending continuously in each one of the plurality of cell units along the arranging direction of the plurality of cell chips in each of the plurality of cell strings, each of the plurality of longitudinal reflective strips covering edges of the cell chips in at least one of the plurality of cell strings, the edge extending in the arranging direction of the plurality of cell chips in the at least one of the plurality of cell strings, and at least one of the plurality of longitudinal reflective strips being broken at a location adjacent to the at least one cell chip covered by the at least one junction box to form at least one opening,
wherein the opening is located at the cell chip covered by the junction box, and a light-receiving area of the cell chip covered by the junction box in the cell unit is equal to a light-receiving area of each of other cell chips in the cell unit.

2. The double-glazed photovoltaic assembly according to claim 1, wherein two adjacent cell chips in each of the plurality of cell strings that are adjacent to the junction box are a first cell chip and a second cell chip, the second cell chip being located at one side of the first cell chip that is away from the junction box;
two adjacent cell units of the plurality of cell units are a first cell unit and a second cell unit; and
the opening has one end located between the first cell chip and the second cell chip of a cell string of the first cell unit and another end located between the first cell chip and the second cell chip of a cell string of the second cell unit.

3. The double-glazed photovoltaic assembly according to claim 2, wherein the cell chip has a width D in the arranging direction of the plurality of cell chips in each of the plurality of cell strings, a portion of the opening that is in the first cell unit has a length d, and the D and d satisfy d=D and 82 mm≤D≤120 mm.

4. The double-glazed photovoltaic assembly according to claim 2, wherein each of the plurality of longitudinal reflective strips has one opening.

5. The double-glazed photovoltaic assembly according to claim 1, wherein the plurality of longitudinal reflective strips comprise:
   two edge reflective strips located at edges of the cell unit layer in the direction in which the plurality of cell strings are arranged, each of the two edge reflective strips covering the edges of the cell chips in the corresponding cell string; and
   at least one middle reflective strip located between the two edge reflective strips, the middle reflective strip being located between two adjacent cell strings and covering edges of the cell chips in the two adjacent cell strings.

6. The double-glazed photovoltaic assembly according to claim 5, wherein the reflective layer further comprises:
   a plurality of first transverse reflective strips connected between the two edge reflective strips and spaced apart from each other along the arranging direction of the plurality of cell chips in each of the plurality of cell strings, and each of the plurality of first transverse reflective strips extending along the direction in which the plurality of cell strings are arranged and covering edges of the corresponding cell chips.

7. The double-glazed photovoltaic assembly according to claim 6, wherein in each of the plurality of cell units, the first transverse reflective strip is provided between every two adjacent cell chips along the arranging direction of the plurality of cell chips in each of the plurality of cell strings, and the first transverse reflective strip covers edges of two corresponding adjacent cell chips in all of the cell strings.

8. The double-glazed photovoltaic assembly according to claim 6, wherein each of the plurality of first transverse reflective strips has a width smaller than that of each of the plurality of longitudinal reflective strips.

9. The double-glazed photovoltaic assembly according to claim 6, wherein the first transverse reflective strip has a width W1, and W1 satisfies 0 mm<W1≤6 mm.

10. The double-glazed photovoltaic assembly according to claim 6, wherein the reflective layer further comprises:
    a second transverse reflective strip located between two cell units that are adjacent to each other in the plurality of cell units, the second transverse reflective strip extending along the direction in which the plurality of cell strings are arranged, and the second transverse reflective strip covering edges of cell chips adjacent to each other in the two cell units adjacent to each other.

11. The double-glazed photovoltaic assembly according to claim 1, wherein one of the plurality of longitudinal reflective strips faces towards the junction box and is formed with the opening, the opening is formed as a through-hole for a wire to pass through, and the through-hole faces towards the junction box.

12. The double-glazed photovoltaic assembly according to claim 1, wherein the plurality of longitudinal reflective strips comprise a plurality of first reflective strips and a plurality of second reflective strips, and one first reflective strip is provided between every two second reflective strips that are adjacent to each other; and
    the at least one junction box comprises a plurality of junction boxes, the plurality of junction boxes are in one-to-one correspondence with the plurality of first reflective strips, and each of the plurality of second reflective strips is provided with the opening.

13. The double-glazed photovoltaic assembly according to claim 12, wherein each of the plurality of first reflective strips is provided with the opening, and the opening of the first reflective strip has a length smaller than that of the opening of the second reflective strip.

14. The double-glazed photovoltaic assembly according to claim 1, wherein the opening has length L, and L satisfies 0 mm<L≤500 mm.

15. The double-glazed photovoltaic assembly according to claim 1, wherein a distance d between two cell chips that are adjacent to each other in each of the plurality of cell strings satisfies 0 mm≤d≤2 mm.

16. The double-glazed photovoltaic assembly according to claim 1, wherein each of the plurality of longitudinal reflective strips has a width W2, and W2 satisfies 2 mm≤W2≤15 mm.

17. The double-glazed photovoltaic assembly according to claim 1, wherein the reflective layer is a reflective coating layer applied onto a surface of one side of the backplate that is adjacent to the cell unit layer; or
    an encapsulation film is provided between the backplate and the cell unit layer, and the reflective layer is provided on the encapsulation film.

18. The double-glazed photovoltaic assembly according to claim 1, wherein each of the plurality of longitudinal reflective strips has a length of a, the maximum distance between two cell chips farthest away from each other in the arranging direction of the plurality of cell chips in each of the plurality of cell strings is b, and a and b satisfy 0.7≤a/b≤1.3.

19. The double-glazed photovoltaic assembly according to claim 1, wherein the number of the plurality of cell units is two, the two cell units are connected in parallel, each of the two cell units comprises six cell strings connected in series, and every two cell strings that are adjacent to each other along the direction in which the plurality of cell strings are arranged form one group of cell strings; and
    the number of the at least one junction boxes is three, and each of the three junction boxes is located between two cell strings in a corresponding group of cell strings.

* * * * *